United States Patent
Nejad et al.

(10) Patent No.: US 7,547,559 B2
(45) Date of Patent: *Jun. 16, 2009

(54) METHOD FOR FORMING MRAM BIT HAVING A BOTTOM SENSE LAYER UTILIZING ELECTROLESS PLATING

(75) Inventors: Hasan Nejad, Boise, ID (US); James G. Deak, Boise, ID (US)

(73) Assignee: Micron Technology, Inc., Boise, ID (US)

(*) Notice: Subject to any disclaimer, the term of this patent is extended or adjusted under 35 U.S.C. 154(b) by 96 days.

This patent is subject to a terminal disclaimer.

(21) Appl. No.: 11/657,725

(22) Filed: Jan. 25, 2007

(65) Prior Publication Data

US 2007/0161127 A1 Jul. 12, 2007

Related U.S. Application Data

(60) Continuation of application No. 10/761,247, filed on Jan. 22, 2004, now Pat. No. 7,183,621, which is a division of application No. 10/146,890, filed on May 17, 2002, now Pat. No. 6,761,644.

(51) Int. Cl.
*H01L 21/00* (2006.01)

(52) U.S. Cl. .................. 438/3; 257/E21.665

(58) Field of Classification Search .............. 438/3; 257/E21.665; 365/158
See application file for complete search history.

(56) References Cited

U.S. PATENT DOCUMENTS

| | | | |
|---|---|---|---|
| 6,172,902 B1 | 1/2001 | Wegrowe et al. | |
| 6,555,858 B1 | 4/2003 | Jones et al. | |
| 6,716,644 B2 * | 4/2004 | Nejad et al. ............. | 438/3 |
| 6,793,961 B2 | 9/2004 | Nikitin et al. | |
| 7,183,621 B2 * | 2/2007 | Nejad et al. ............. | 257/421 |
| 7,285,811 B2 * | 10/2007 | Yates et al. ............. | 257/295 |
| 2003/0119210 A1 | 6/2003 | Yates et al. | |

* cited by examiner

*Primary Examiner*—Mark Prenty
(74) *Attorney, Agent, or Firm*—Dickstein Shapiro LLP

(57) ABSTRACT

The present invention provides a method of forming an MRAM cell which minimizes the occurrence of electrical shorts during fabrication. A first conductor in a trench is provided in an insulating layer and an upper surface of the insulating layer and the first conductor is planarized. Then, a dielectric layer is deposited to a thickness slightly greater than the desired final thickness of a sense layer, which is formed later. The dielectric layer is then patterned and etched to form an opening for the cell shapes over the first conductor. Then, a permalloy is electroplated in the cell shapes to form the sense layer. The sense layer and dielectric layer are flattened and then a nonmagnetic tunnel barrier layer is deposited. Finally, the pinned layer is formed over the tunnel barrier layer.

15 Claims, 13 Drawing Sheets

METHOD FOR FORMING MRAM BIT HAVING A BOTTOM SENSE LAYER UTILIZING ELECTROLESS PLATING

CROSS REFERENCE TO RELATED APPLICATIONS

The present application is a continuation of U.S. application Ser. No. 10/761,247, filed on Jan. 22, 2004 (now U.S. Pat. No. 7,183,621, issued Feb. 27, 2007), which in turn is a divisional of U.S. application Ser. No. 10/146,890, filed May 17, 2002 (now U.S. Pat. No. 6,716,644, issued Apr. 6, 2004), the disclosures of which are herewith incorporated by reference in their entirety.

FIELD OF INVENTION

The present invention relates to a magnetic random access memory (MRAM) and a fabricating method thereof, and more particularly to a method of forming an MRAM cell having a bottom sense layer.

BACKGROUND OF THE INVENTION

Magnetic random access memories (MRAMs) employ memory cells having magnetic multilayer films as storage elements. When in use, an MRAM cell stores information as digital bits, in the form of relative magnetic orientations of spaced thin magnetic multilayer films forming each memory cell. Each MRAM cell has two stable magnetic film orientations, one which produces a high resistance across the cell representing e.g. a logic state 0 and another which produces a lower resistance across the cell representing e.g. a logic state 1, or vice versa.

A typical multilayer-film MRAM array includes a number of bit or digit (column) lines intersected by a number of word (row) lines. An MRAM cell is formed between a digit and row line at each intersection.

The basic memory MRAM cell has a first pinned ferromagnetic layer and a second free (sense) magnetic layer with a nonmagnetic layer between them. The pinned ferromagnetic layer has a fixed magnetic orientation while the free (sense) layer may have two different magnetic orientations, depending on the logical data stored in the cell. Each of the ferromagnetic layers is actually formed of a stack of as many as ten different overlapping material layers. Fabrication of such stacks requires deposition of the thin materials layer by layer, according to a predefined order.

FIG. 1 shows an exemplary conventional MRAM structure including MRAM cells 22 formed as layer stacks which have three respective associated bit or digit lines 18. The digit lines 18, typically formed of copper (Cu), are first formed in an insulating layer 16 formed over underlayers 14 of an integrated circuit (IC) substrate 10. Underlayers 14 may include, for example, portions of integrated circuitry, such as CMOS circuitry. A pinned layer 20, typically formed of ferromagnetic materials, is provided over each digit line 18. A nonmagnetic layer of, for example, $Al_2O_3$ is formed over the pinned layer 20. A free (sense) layer 21 is provided over the nonmagnetic layer. The MRAM cells 22 are coupled to a word line 23 that intersects three pinned layers 20 and associated cells 22. The word line 23 and bit line 18 may also be interchanged.

FIG. 2 illustrates a side sectional view of the MRAM stacks 22 of FIG. 1. As shown, pinned layer 20 and sense layer 21 are comprised of several individual layers, including a bottom conductive barrier layer 24 formed of, for example, Ta, at the base of the pinned layer 20. The barrier layer 20 also lines the trenches in which the bit lines 18 are formed. Also, pinned layer 20 and sense layer 21 are separated by a magnetically and electrically nonconductive tunnel junction layer 25, for example, $Al_2O_3$.

Typically, during an etching step to define the cells 22, utilizing, for example, ion milling, the conductive layer 24 may sputter back onto the sidewall of stacks 22 forming a side conductive layer 26 creating an undesirable electrical short between the pinned 20 and sense 21 layers. Thus, during a read operation, the current may flow through the side conductive layer 26 rather than flow through the tunnel junction layer 25, because of a short produced by layer 26 causing improper resistance sensing. Hence, what is needed is a method of fabricating an MRAM cell which will not create a short as described above.

SUMMARY OF THE INVENTION

The present invention provides a method of forming an MRAM bit having a bottom sense layer utilizing electroless plating. In an exemplary embodiment of the invention, a first conductor in a trench is provided in an insulating layer and an upper surface of the insulating layer and the first conductor is planarized. Then, a dielectric layer is deposited to a thickness slightly greater than the desired thickness of the sense layer, which is formed later. The dielectric layer is then patterned and etched to form an opening or formed cell shapes over the first conductor. Then, a permalloy is electroplated in the formed cell shapes to form the sense layer. The formed sense layer is pre-sputter cleaned and then a tunnel barrier layer is deposited. Finally, the pinned layer is formed over the tunnel barrier layer.

The above advantages and features of the invention as well as others will be more clearly understood from the following detailed description which is provided in connection with the accompanying drawings.

DETAILED DESCRIPTION OF THE INVENTION

In the following detailed description, reference is made to various exemplary embodiments of the invention. These embodiments are described with sufficient detail to enable those skilled in the art to practice the invention, and it is to be understood that other embodiments may be employed, and that structural and electrical changes may be made without departing from the spirit or scope of the present invention.

The term "substrate" used in the following description may include any semiconductor-based structure that has a semiconductor surface. Structure must be understood to include silicon, silicon-on insulator (SOI), silicon-on sapphire (SOS), doped and undoped semiconductors, epitaxial layers of silicon supported by a base semiconductor foundation, and other semiconductor structures. The semiconductor need not be silicon-based. The semiconductor could be silicon-germanium, germanium, or gallium arsenide. When reference is made to substrate in the following description, previous process steps may have been utilized to form regions or junctions in or on the base semiconductor or foundation.

Figure 1:
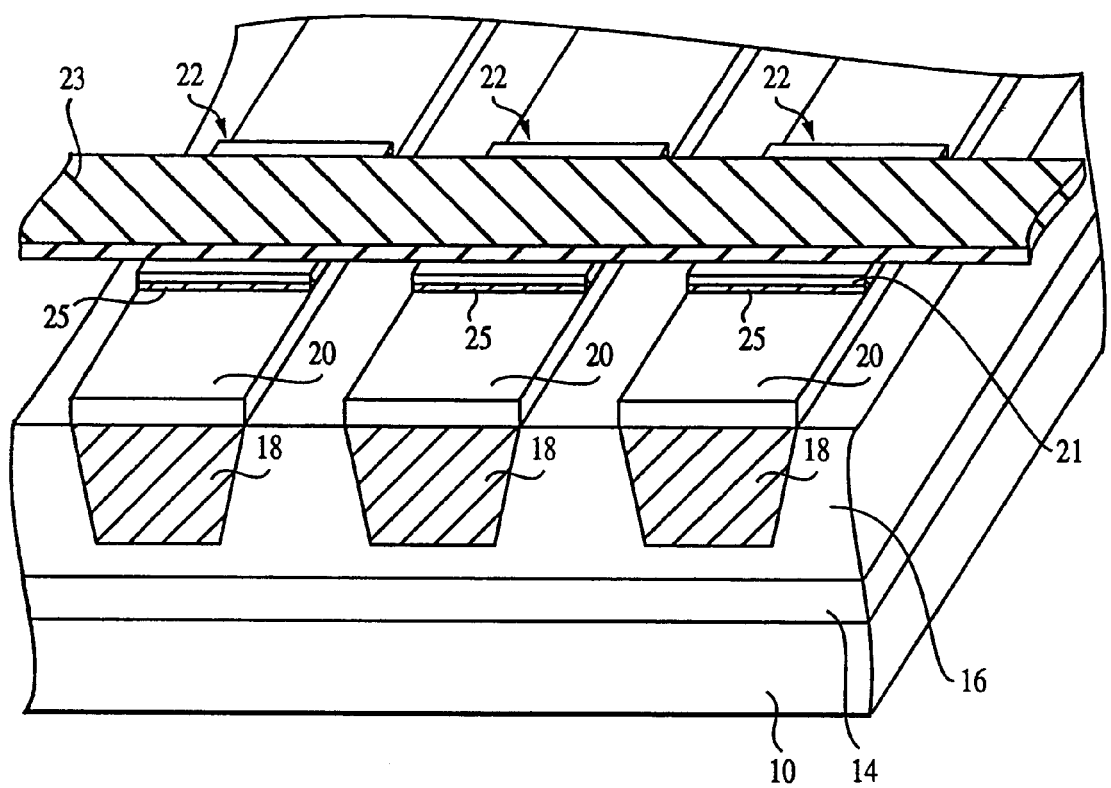
FIG. 1 is a schematic three-dimensional view of a portion of a conventional MRAM structure.
Figure 2:
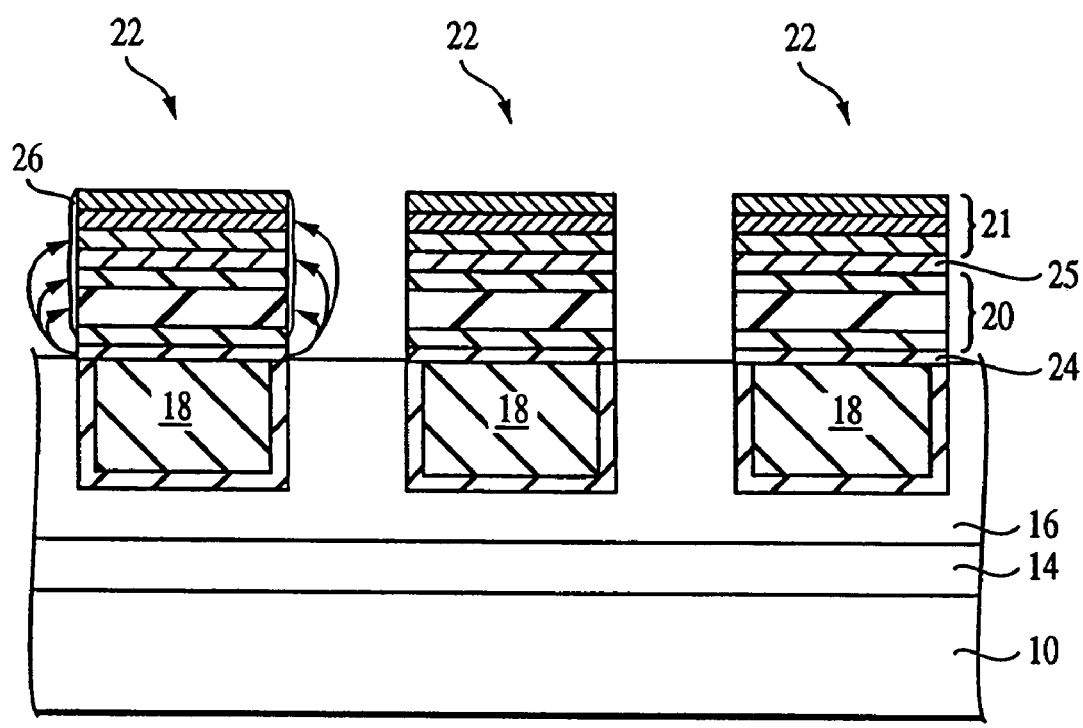
FIG. 2 is a side sectional view of the MRAM structure of FIG. 1 showing a side conductive layer formed thereon.
Figure 3:
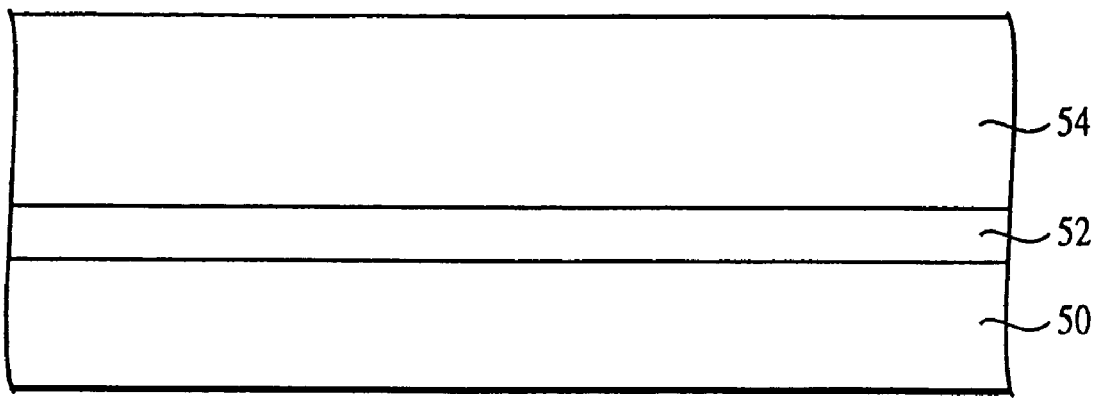
FIG. 3 illustrates a partial cross-sectional view of a semiconductor topography, at an intermediate stage of the processing, wherein a MRAM structure will be constructed in accordance with the present invention.

Referring now to the drawings, where like elements are designated by like reference numerals, FIGS. 3-19 illustrate an exemplary embodiment of a method of forming MRAM structures in accordance with the invention. FIG. 3 depicts a portion of a semiconductor substrate 50 on which underlying layer 52 has been already formed according to well-known methods of the prior art. The underlying layer 52 could include, for example, circuit layers forming CMOS devices and circuits. Next, an insulating layer 54 is formed over the substrate 50 and the underlying layer 52. In an exemplary embodiment of the invention, the insulating layer 54 is blanket deposited by spin coating to a thickness of about 1,000 Angstroms to about 10,000 Angstroms. However, other known deposition methods, such as sputtering by chemical vapor deposition (CVD), plasma enhanced CVD (PECVD), or physical vapor deposition (PVD), may be used also in accordance with the characteristics of the IC device already formed. The insulating layer 54 may be formed of a conventional insulator, for example, BPSG, a thermal oxide of silicon, such as SiO or $SiO_2$, or a nitride such as $Si_3N_4$. Alternatively, a high temperature polymer, such as a polyimide, or a low dielectric constant inorganic material may also be employed.

Figure 4:
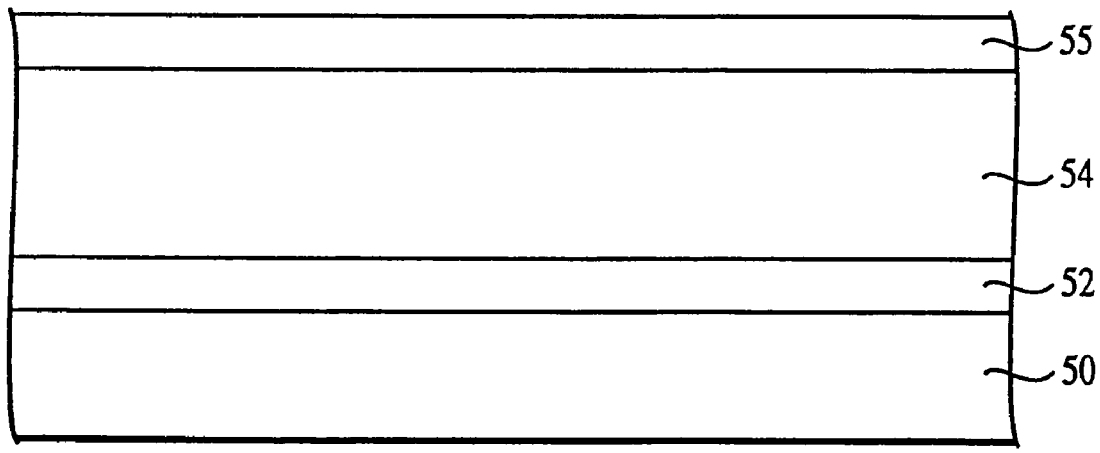
FIG. 4 illustrates a partial cross-sectional view of the MRAM structure at a stage of processing subsequent to that shown in FIG. 3.

Next, as illustrated in FIG. 4, a photoresist layer 55 is formed over the insulating layer 54. The photoresist layer 55 is exposed through a mask 56 (FIG. 5) with high-intensity UV light. The mask 56 includes a suitable pattern of opaque and clear regions in a desired pattern to be formed in the insulating layer 54. This way, portions 55a (FIG. 5) of the photoresist layer 55 are exposed through openings 56a of the mask 56 wherever portions of the insulating layer 54 need to be removed.

Figure 5:
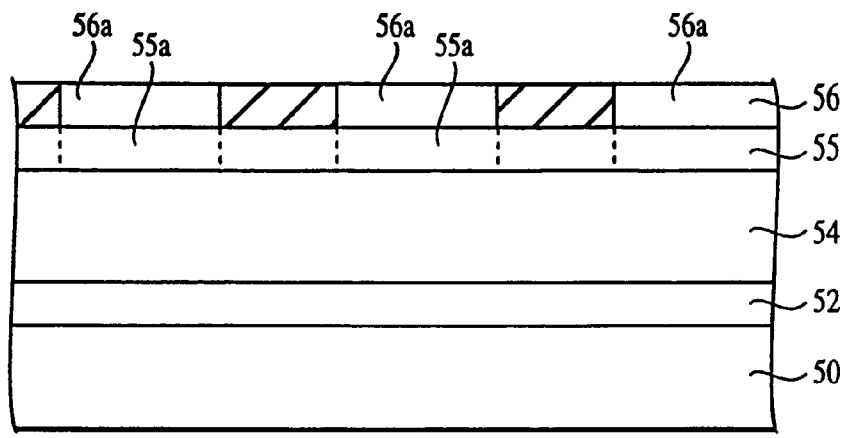
FIG. 5 illustrates a partial cross-sectional view of the MRAM structure at a stage of processing subsequent to that shown in FIG. 4.
Figure 6:
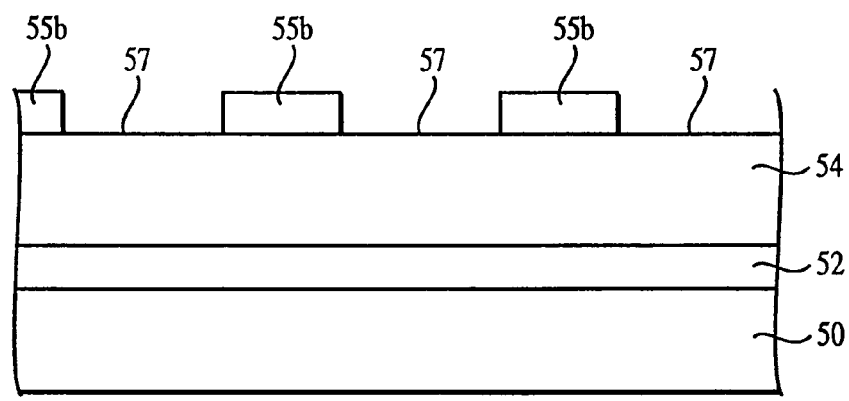
FIG. 6 illustrates a partial cross-sectional view of the MRAM structure at a stage of processing subsequent to that shown in FIG. 5.

Although FIG. 5 schematically-illustrates mask 56 positioned over the photoresist layer 55, those skilled in the art will appreciate that mask 56 is typically spaced from the photoresist layer 55 and light passing through mask 56 is focused onto the photoresist layer 55. After exposure and development of the exposed portions 55a, portions 55b of the unexposed and undeveloped photoresist are left over the insulating layer 54, as shown in FIG. 6. This way, openings 57 (FIG. 6) are formed in the photoresist layer 55.

Figure 7:
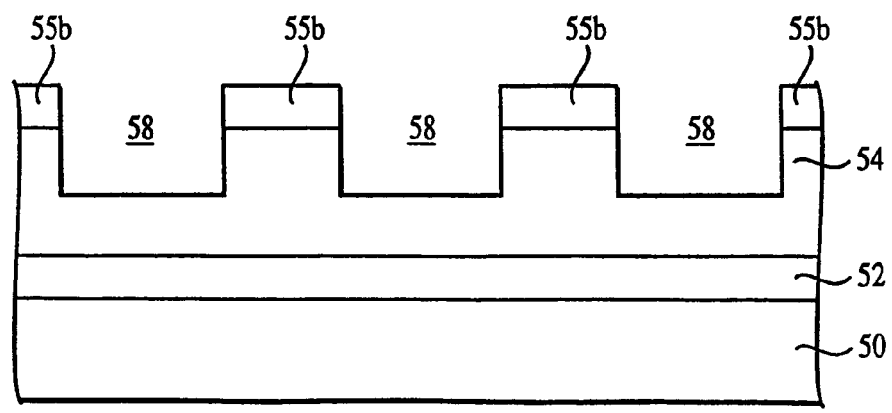
FIG. 7 illustrates a partial cross-sectional view of the MRAM structure at a stage of processing subsequent to that shown in FIG. 6.
Figure 8:
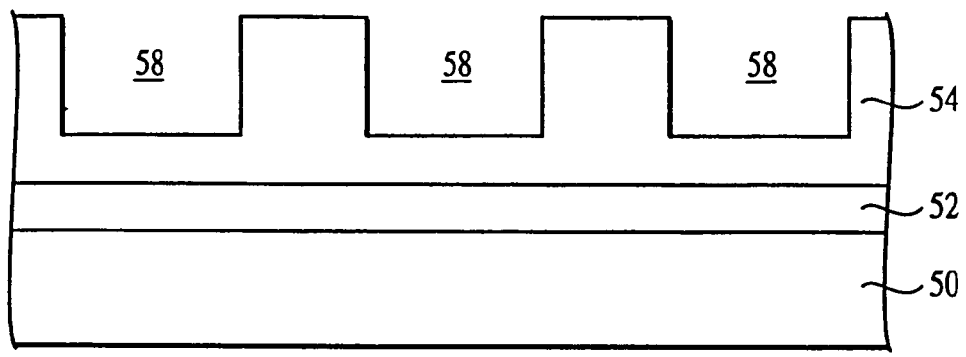
FIG. 8 illustrates a partial cross-sectional view of the MRAM structure at a stage of processing subsequent to that shown in FIG. 7.

An etch step is next performed to obtain trenches 58 in the insulating layer 54, as illustrated in FIGS. 7-8. The trenches 58 are etched to a depth of about 500 Angstroms to about 2,000 Angstroms, more preferably of about 1,000 Angstroms. Subsequent to the formation of the trenches 58, the remaining portions 55b of the positive photoresist layer 55 are then removed by chemicals, such as hot acetone or methylethylketone, or by flooding the substrate 50 with UV irradiation to degrade the remaining portions 55b to obtain the structure of FIG. 8.

Figure 9:
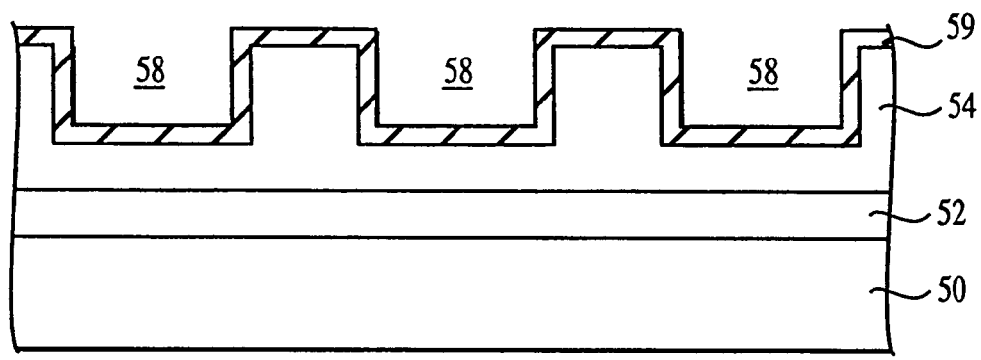
FIG. 9 illustrates a partial cross-sectional view of the MRAM structure at a stage of processing subsequent to that shown in FIG. 8.

Subsequent to the formation of the trenches 58 (FIGS. 7-8), a thin barrier layer 59 is formed in the trenches 58 and over the insulating layer 54, and then chemical mechanical polished to remove barrier layer 59 material from the top portions of the insulating layer 54, as shown in FIG. 9. The barrier layer 59 may comprise barrier materials such as tantalum (Ta), titanium (Ti), titanium-tungsten (TiW), titanium nitride (TiN) or chromium (Cr), among others. The barrier layer 59 forms a strong mechanical and chemical bond between the conductive material which will be formed later and the insulating layer 54 to help prevent peeling of the formed conductive layer from the insulating layer. In a preferred embodiment of the invention, the barrier layer 59 is formed of sputtered tantalum. In this embodiment, tantalum is deposited to a thickness of about 5 nm to about 10 nm. This layer may also be comprised of a ferromagnetic material deposited on the barrier or in place of the barrier for the purpose of field focusing.

Figure 10:
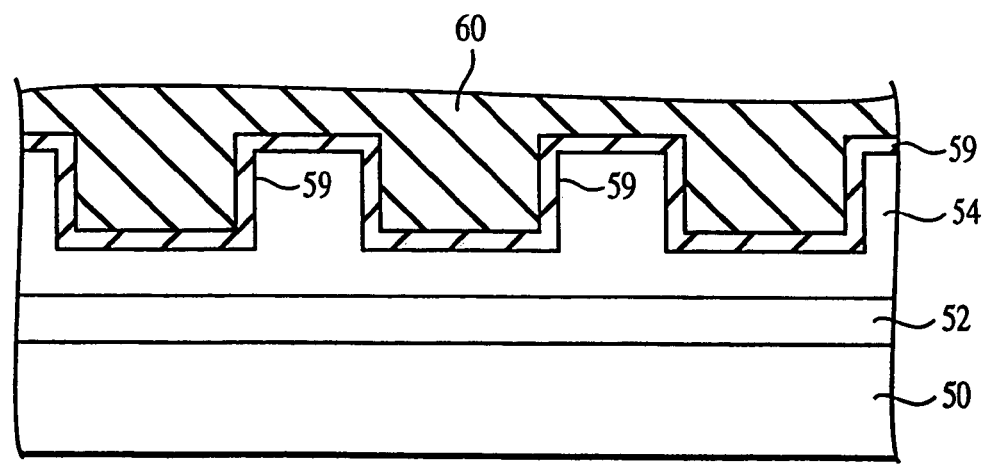
FIG. 10 illustrates a partial cross-sectional view of the MRAM structure at a stage of processing subsequent to that shown in FIG. 9.

Next, as illustrated in FIG. 10, a conductive material layer 60 is formed over the barrier layer 59 and the insulating layer 54 to fill in the trenches 58. In a preferred embodiment, the conductive material comprises copper (Cu). However, other conductive materials such as aluminum, tungsten or gold, among others, may be used also. Further, metal alloys may be employed also, depending on desired characteristics of the IC device.

Figure 11:
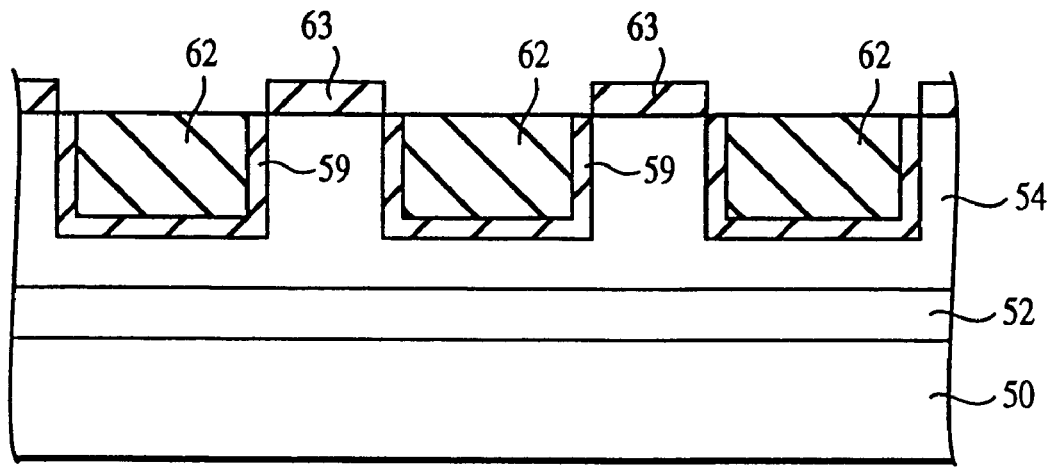
FIG. 11 illustrates a partial cross-sectional view of the MRAM structure at a stage of processing subsequent to that shown in FIG. 10.

The conductive material layer 60 is formed over the barrier layer 59 by deposition, for example, and then excess material is removed to form metal lines 62 (FIG. 11). In an exemplary embodiment of the present invention, the excess conductive material layer 60 and portions the barrier layer 59 that are outside of the trenches 58 are removed by means of chemical mechanical polishing (CMP). The top surfaces of the remaining barrier layer 59 inside the trenches 58 and the metal lines 62 are generally flat and uniform across the entire surface of the substrate, as shown in FIG. 11. Each metal line 62 will form the bit or digit line of a conventional MRAM structure.

Referring still to FIG. 11, in an exemplary embodiment of the present invention, the processing steps for the completion of the MRAM structures 100 are now carried out. As such, a dielectric layer 63 is deposited to a thickness (e.g., about 2-3 nm) slightly greater than the desired final thickness of a sense layer, which is formed later. The dielectric layer 63 is then patterned and etched to form the cell shaped openings over the first conductor 62. In an exemplary embodiment of the invention, the opening is a trench. However, the openings may also be formed as separate isolated areas within dielectric layer 63 where memory cells are to be fabricated. In this case, each opening is entirely surrounded by dielectric layer 63.

Figure 12:
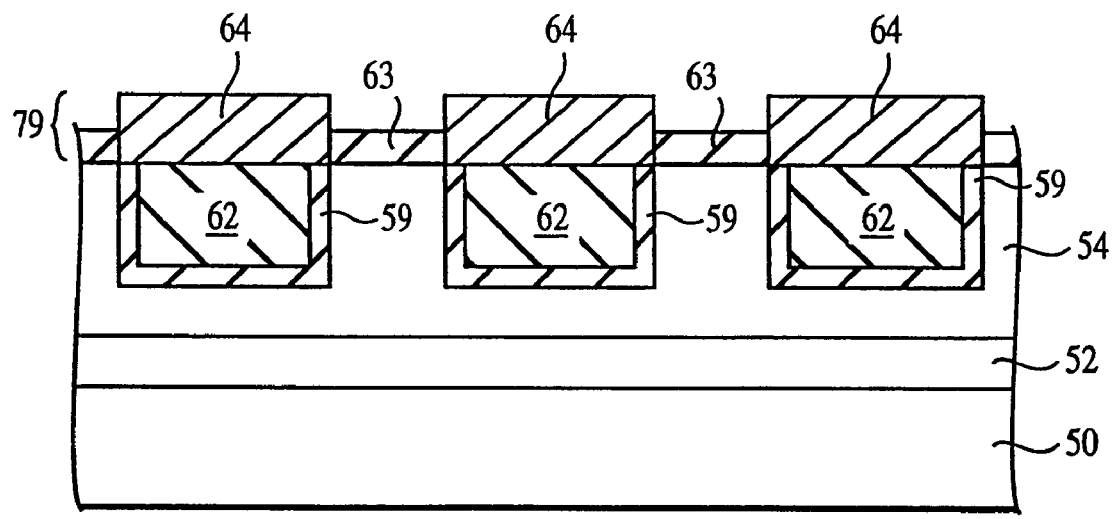
FIG. 12 illustrates a partial cross-sectional view of the MRAM structure at a stage of processing subsequent to that shown in FIG. 11.

Referring now to FIG. 12, a first nickel-iron (NiFe) permalloy is provided in the cell shaped openings to form the sense layer 64. The permalloy is electroplated in a electroless plating bath for a predetermined period of time depending on the desired thickness. A seed layer is not required as the NiFe is electroplated directly on the first conductor 62 as well and extends to the side walls of the dielectric layer 63. In an exemplary embodiment of the present invention, the NiFe is electroplated at about 80-90° C. Sense layer 64 and dielectric layer 63 constitute a first magnetic member 79 formed over the first conductor 62. Next, top portions of the sense layer 64 and dielectric layer 63 are pre-sputtered to remove and clean any unwanted portions and to provide a smooth flat surface for the subsequent MRAM cell layers, as described below. Alternatively, chemical mechanical polishing can also be utilized.

Figure 13:
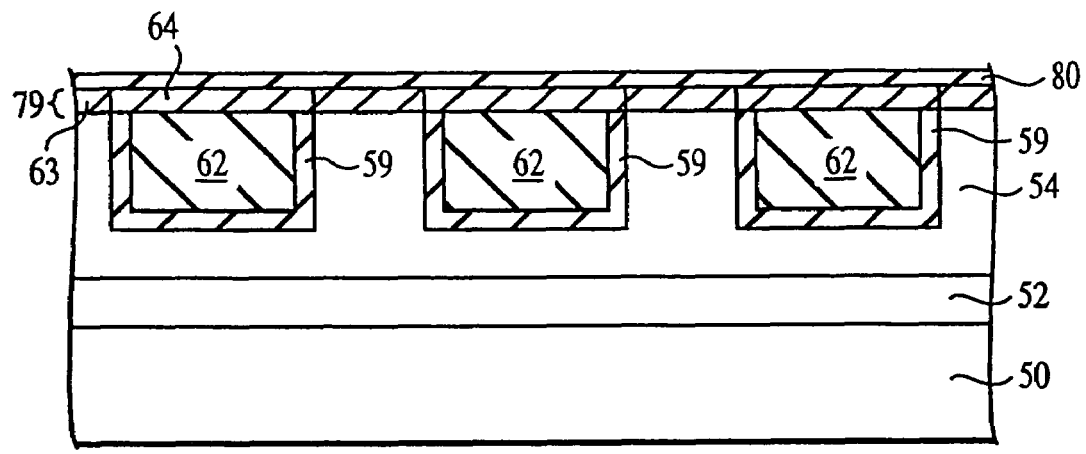
FIG. 13 illustrates a partial cross-sectional view of the MRAM structure at a stage of processing subsequent to that shown in FIG. 12.

Referring now to FIG. 13, following the electroplating and flatting of the sense layer 64, a nonmagnetic, electrically nonconductive tunnel barrier layer 80 formed of, for example, aluminum oxide ($Al_2O_3$) (of about 5-25 Angstroms thick, more preferably of about 15 Angstroms thick) is formed overlying the first magnetic member 79. Although aluminum oxide is the preferred material, it must be understood that the invention is not limited to its use, and other nonmagnetic materials, such as copper (Cu), titanium oxide ($TiO_2$), magnesium oxide (MgO), silicon oxide ($SiO_2$) or aluminum nitride (AlN), may be used also.

Figure 14:
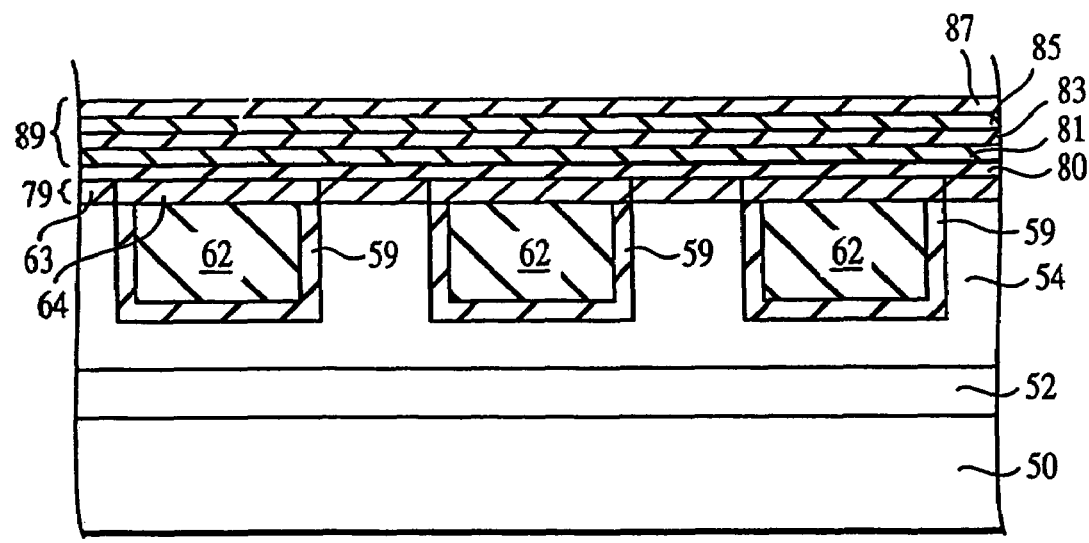
FIG. 14 illustrates a partial cross-sectional view of the MRAM structure at a stage of processing subsequent to that shown in FIG. 13.
Figure 15:
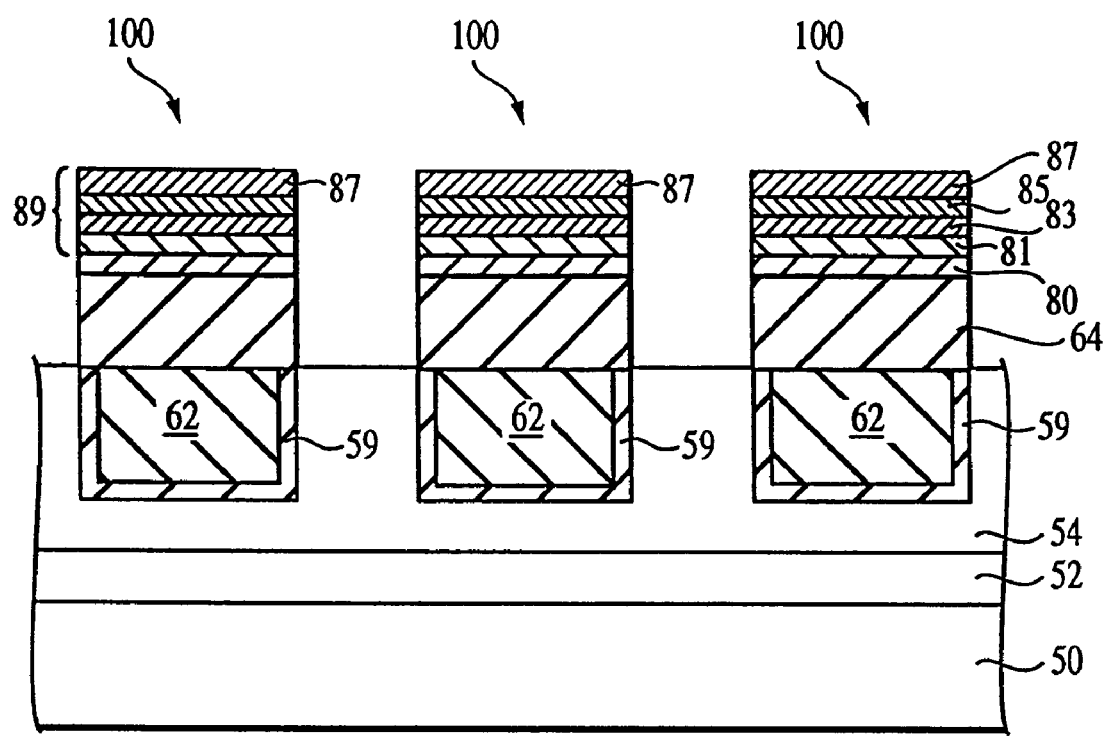
FIG. 15 illustrates a partial cross-sectional view of the MRAM structure at a stage of processing subsequent to that shown in FIG. 14.

Referring now to FIG. 14, a second nickel-iron (NiFe) layer 81 (of about 10-100 Angstroms thick, more preferably of about 60 Angstroms thick), a manganese-iron (MnFe) layer 83 (of about 10-100 Angstroms thick, more preferably of about 100 Angstroms thick), a third nickel-iron (NiFe) layer 85 (of about 10-100 Angstroms thick, more preferably of about 60 Angstroms thick) and a tantalum (Ta) layer 87 (of about 20-400 Angstroms thick, more preferably of about 50 Angstroms thick) are successively blanket deposited over the nonconductive layer 80, to form the second pinned magnetic member 89. Deposition of the layers 81, 83, 85 and 87 may be accomplished by magnetron sputtering, for example. However, other conventional deposition methods may be used also, as desired.

Figure 16:
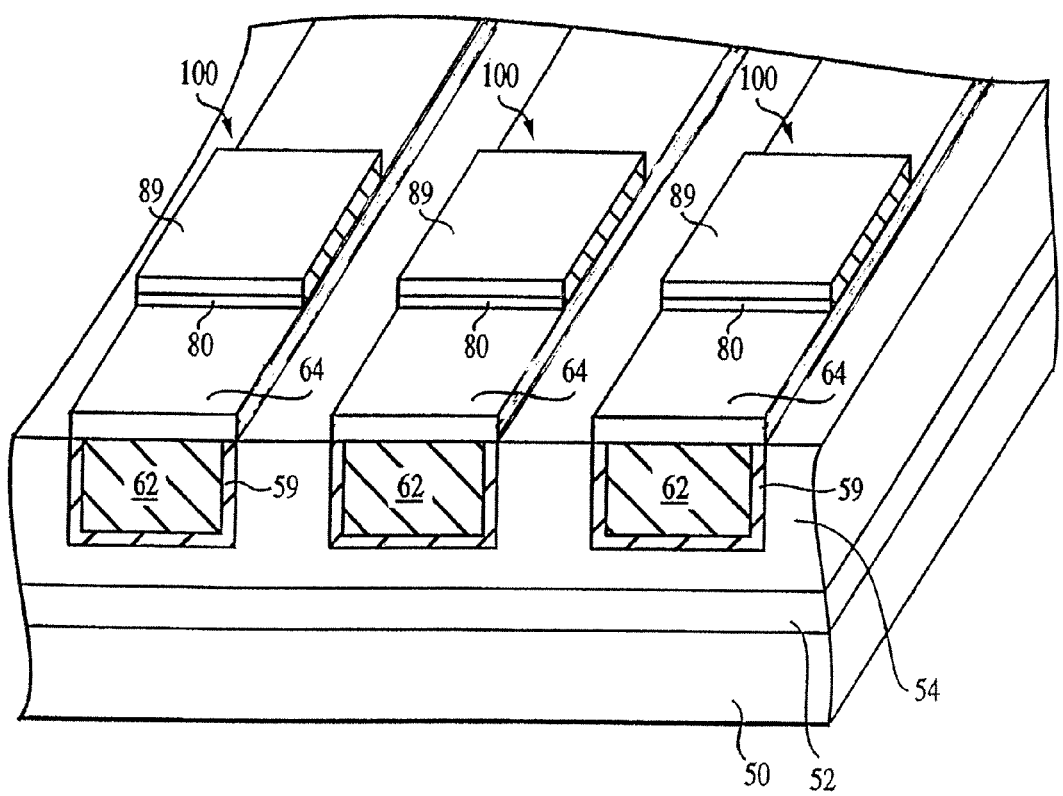
FIG. 16 illustrates a partial cross-sectional view of the MRAM structure at a stage of processing subsequent to that shown in FIG. 15.

Next, layers 63, 80, 81, 83, 85 and 87 (FIGS. 12-14) are patterned into a plurality of individual MRAM cells 100 (FIGS. 15-16) arranged in rows and columns. Thus, each MRAM structure 100 includes the sense layer 64 (as part of the first magnetic member 79) separated from a pinned layer 89 by the nonmagnetic tunnel barrier layer 80. For simplicity, the multilayer stack forming the pinned layer 89 is illustrated in FIG. 16 as a single layer. It must be understood, however, that the pinned layer 89 includes portions of the layers 81, 83, 85 and 87.

Patterning of the plurality of layers forming the pinned layers 89 and the sense layer 64 of the MRAM cell 100 (FIG. 15) may be accomplished by ion milling which typically involves physical sputtering of each layer by an argon ion beam. Patterning may be also accomplished by using a reactive plasma etch, performed, for example, in electron cyclotron resonance (ECR) or other high density plasmas, such as an inductively coupled plasma system, or a helicon plasma system containing chlorine as the source gas. A mixture of chlorine with other gases, such as argon, neon or helium, among others, may be used also. In any event, the pinned layers 89 and sense layers 64 are patterned and etched so that the sense layers 64 sit on the metal lines (first conductors) 62 that form the bottom electrodes of the sense layer 64. Although FIG. 16 illustrates a patterning of the memory cells 100 in which the sense layers 64 extend along the conductors 62, the memory cells 100 can also be patterned with the area of the sense layer 64 being substantially co-extensive with that of the nonmagnetic tunnel barrier layer 80 and the pinned layer 89.

Hence, the present invention provides a method of forming an MRAM bit 100 having a bottom sense layer 64 utilizing electroless plating. A first conductor 62 in a trench is provided in an insulating layer 54 and an upper surface of the insulating layer 54 and the first conductor 62 are planarized. Then, a dielectric layer 63 is deposited to a thickness slightly greater than the desired thickness of the sense layer 64, which is formed later. The dielectric layer 63 is then patterned and etched to form the opening or cell shapes over the first conductor 62. Then, a permalloy is electroplated in the bit shapes to form the sense layer 64. The sense layer 64 is pre-sputtered or CMP flattened and cleaned and then a nonmagnetic, electrically nonconductive layer 80 is deposited. Finally, the pinned layer 89 is formed over the nonconductive layer 80. In this way, the sense layer 64 is formed in a manner which reduces the possibility of forming the undesired side conductive layer 26, as described above, which causes shorts. In other words, the sense layer 64 is protected by the sacrificial dielectric layer 63 during the etching process to form the MRAM cells 100.

Figure 17:
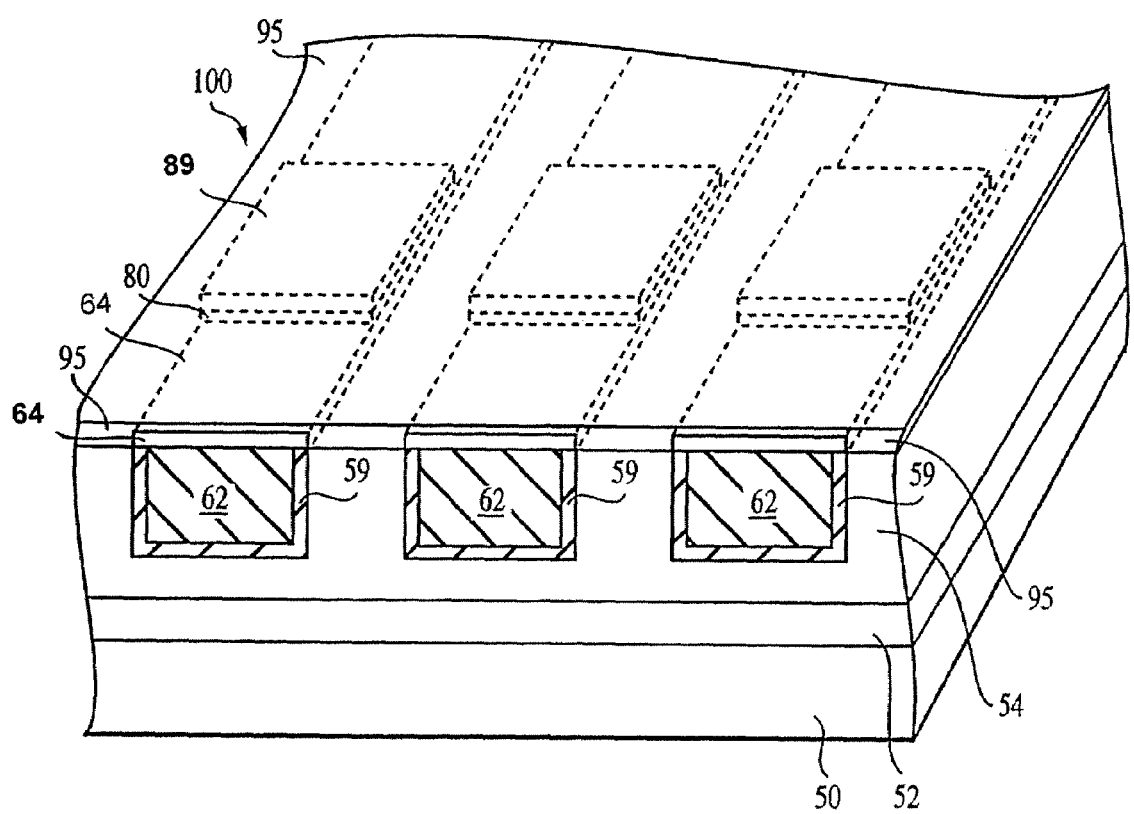
FIG. 17 is a partial three-dimensional view of the MRAM structure at a stage of processing subsequent to that shown in FIG. 16.

Next, an insulating layer 95 (FIG. 17) is formed overlying the substrate 50 including the MRAM structures 100 to a thickness of about 90-10,000 Angstroms, more preferably of about 5,000 Angstroms. The insulating layer 95 completely fills the spaces between any adjacent MRAM cells 100, as shown in FIG. 17. In an exemplary embodiment of the invention, the insulating layer 95 is formed of a nitride material such as silicon nitride ($Si_3N_4$), which may be formed by conventional deposition methods, such as sputtering by chemical vapor deposition (CVD), plasma enhanced CVD (PECVD), or physical vapor deposition (PVD), among others. However, other conventional insulating materials, for example, BPSG, aluminum oxide, a thermal oxide of silicon, such as SiO or $SiO_2$, or a high temperature polymer, such as a polyimide, a low dielectric constant inorganic material, amorphous dielectric, or bias sputtered quartz may also be employed.

Figure 18:
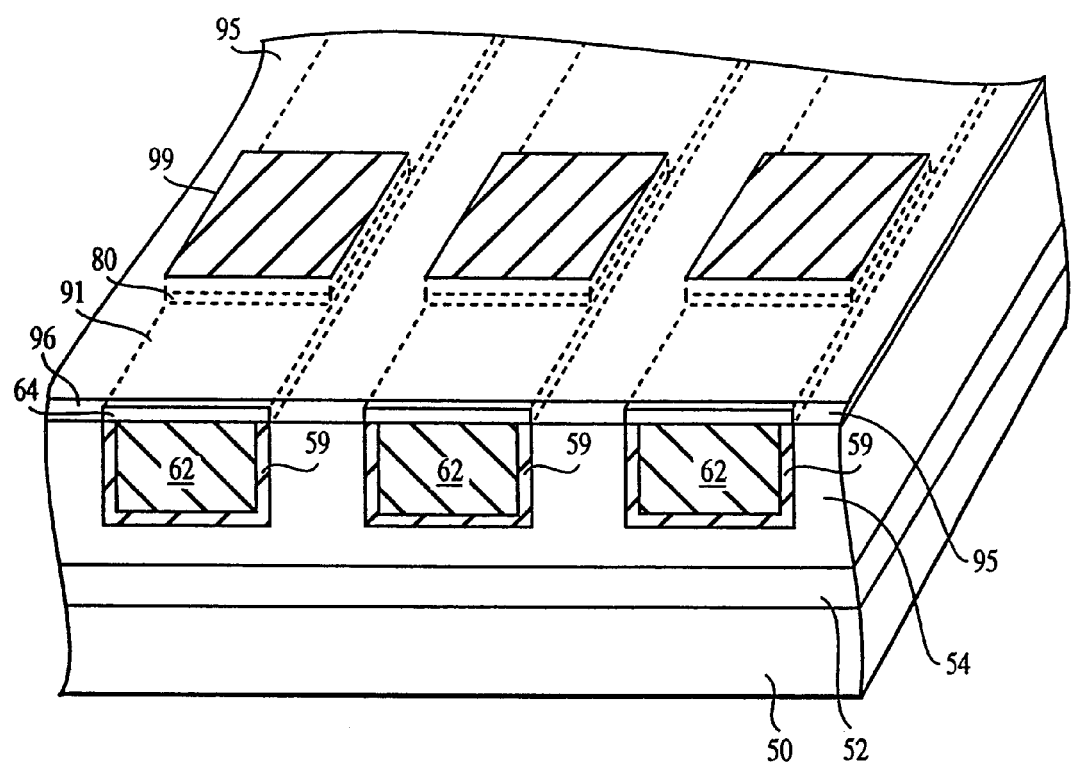
FIG. 18 is a partial three-dimensional view of the MRAM structure at a stage of processing subsequent to that shown in FIG. 17.

Subsequent to the formation of the insulating layer 95 (FIG. 17), portions of the insulating layer 95 that are formed over the top surface of the MRAM cells 100 are removed by means of chemical mechanical polishing (CMP) or well-known RIE dry etching processes. In an exemplary embodiment of the invention, the insulating layer 95 is chemical mechanical polished so that an abrasive polish removes the top surface of the insulating layer 95 above the MRAM cells 100, down to or near the planar surface of the top surface of the tantalum layer 87, to form respective MRAM contacts 99 in a polished insulating layer 96, as illustrated in FIG. 18. This way, the tantalum layer 87, which was formed as part of the pinned layer 89 of the MRAM structure 100, acts as a polishing stop layer in the formation of the contacts 99.

Figure 19:
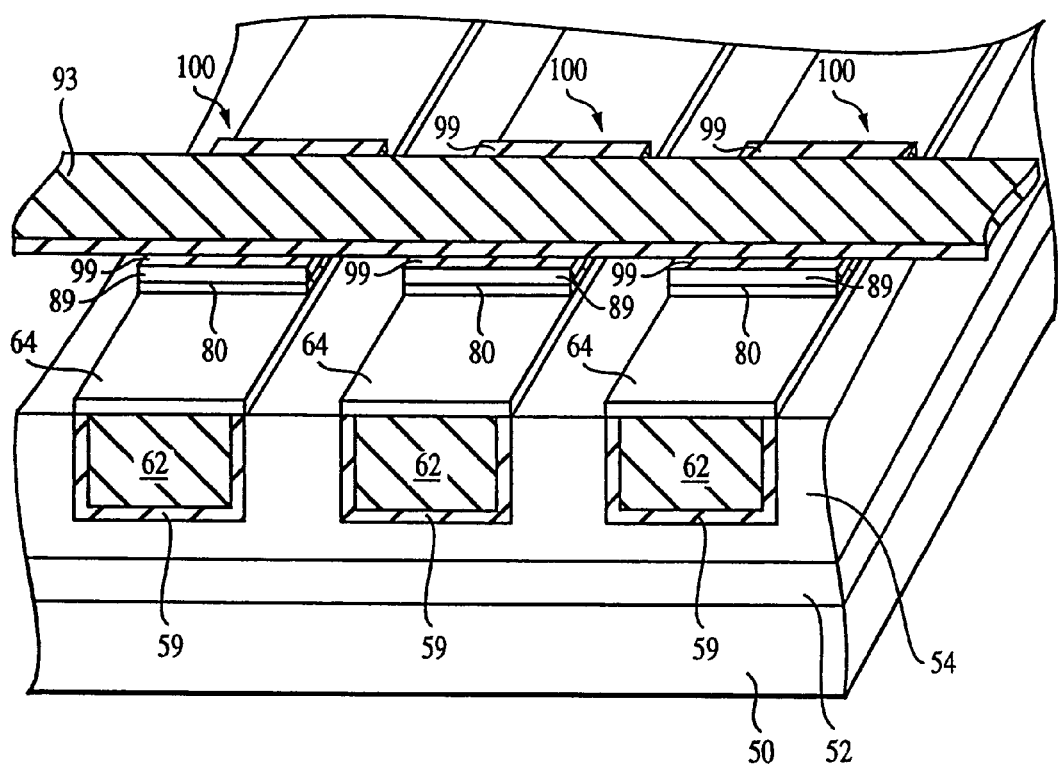
FIG. 19 is a partial three-dimensional view of the MRAM structure at a stage of processing subsequent to that shown in FIG. 18.

Additional steps to create a functional MRAM cell having an upper contact may now be carried out. For example, FIG. 19 illustrates schematically three MRAM cell structures 100 coupled to a word line 93 that intersects three MRAM cells 100 at respective MRAM contacts 99. As known in the art, the word line 93 may be formed of copper, for example, by patterning a mask on a dielectric layer, which is formed over the pinned layers 92 including the MRAM contacts 99, and by forming a trench in which conductive word line 93 is formed on a direction orthogonal to that of the conductor 62. For a better understanding of the invention, the polished insulating layer 96 has been omitted in FIG. 19 to illustrate the sense layer 64 and pinned layers 89 below the word line 93. However, it must be understood that the space between the cells 100 and below the word line 93 is filled with the insulating layer 96.

Although FIG. 19 illustrates MRAM contacts 99 in direct contact and adjacent to the word line 93, it must be understood that the invention is not limited to this embodiment, and other interceding structures, such as conductive plugs and/or metal lines from the MRAM contacts 99 to the word line 93 may be formed also, as desired.

Figure 20:
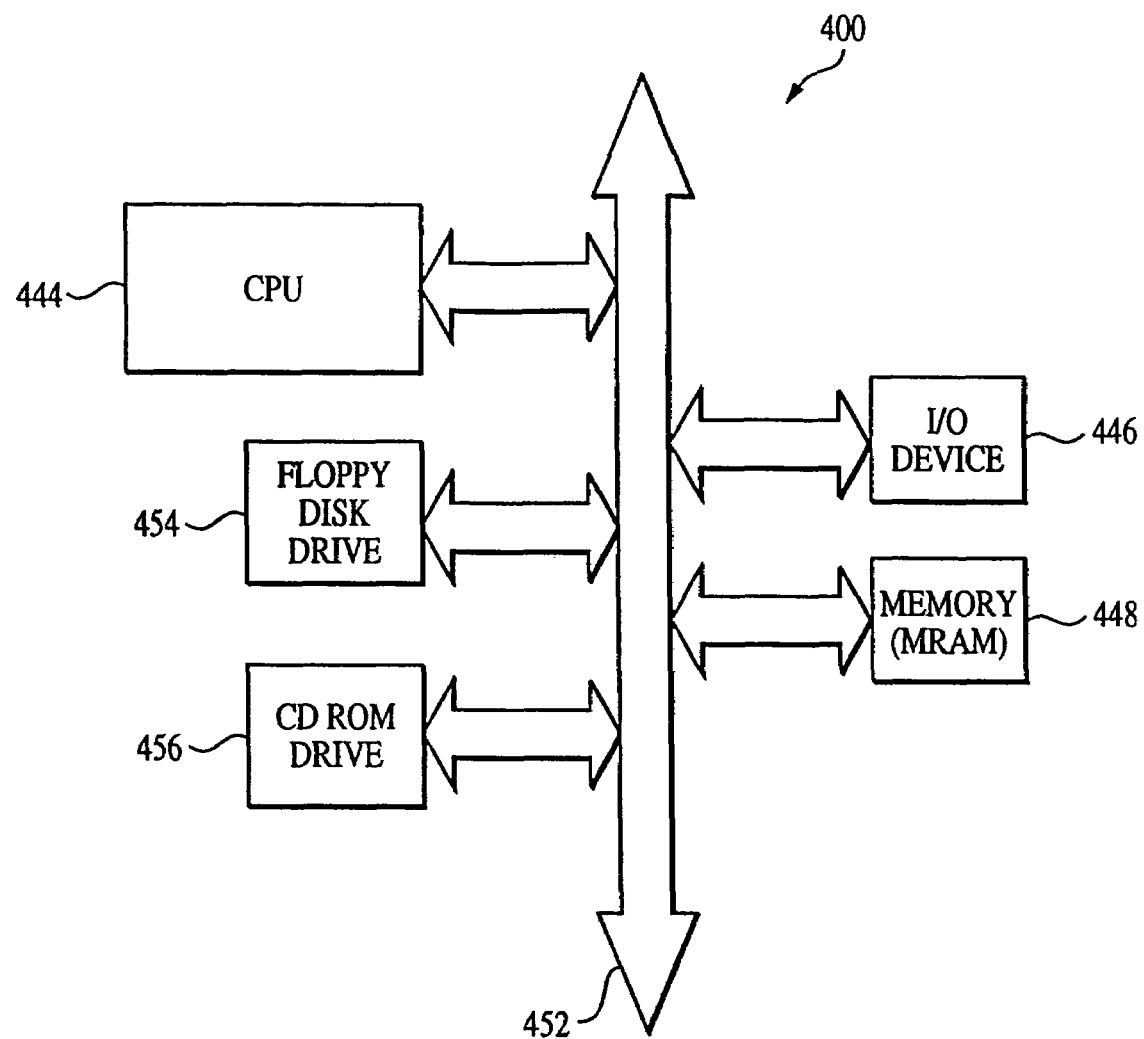
FIG. 20 is a schematic diagram of a processor system incorporating an MRAM constructed in accordance with the present invention.

A typical processor based system 400 which includes a memory circuit 448, for example an MRAM with MRAM cell structures 100 constructed according to the present invention is illustrated in FIG. 20. A processor system, such as a computer system, generally comprises a central processing unit (CPU) 444, such as a microprocessor, a digital signal processor, or other programmable digital logic devices, which communicates with an input/output (I/O) device 446 over a bus 452. The memory 448 communicates with the system over bus 452 and may be coupled to the CPU 444 through a memory controller.

In the case of a computer system, the processor system may include peripheral devices such as a floppy disk drive 454 and a compact disk (CD) ROM drive 456 which also communicate with CPU 444 over the bus 452. Memory 448 may also be combined with the processor, i.e. CPU 444, in a single integrated circuit.

Although the exemplary embodiments described above illustrate the formation of three MRAM cells 100 having respective MRAM contacts 99 (FIGS. 18-19) it is to be understood that the present invention contemplates the formation of an array of cells 100 arranged, for example, in rows and columns in a memory device. In addition, although the exemplary embodiments described above refer to a specific topography of the MRAM structures with specific magnetic materials forming such structures, it must be understood that the invention is not limited to the above-mentioned magnetic materials, and other magnetic and ferromagnetic materials, such as nickel-iron (Permalloy) or iron, among others, may be used also. Further, although the exemplary embodiments described above refer to patterning of the MRAM structures by reactive plasma etching, it must be understood that the present invention contemplates the use of other methods of patterning and etching.

The present invention is thus not limited to the details of the illustrated embodiment. Accordingly, the above description and drawings are only to be considered illustrative of exemplary embodiments which achieve the features and advantages of the present invention. Modifications and substitutions to specific process conditions and structures can be made without departing from the spirit and scope of the present invention. Accordingly, the invention is not to be considered as being limited by the foregoing description and drawings, but is only limited by the scope of the appended claims.

What is claimed as new and desired to be protected by Letters Patent of the United States is:

1. A method of forming a memory cell, the method comprising:
    forming a conductive layer within an insulating layer;
    forming a sense layer in openings that extend longitudinally over the conductive layer;
    forming a nonmagnetic tunnel layer over the sense layer; and
    forming a pinned layer over the nonmagnetic tunnel layer.
2. The method of claim 1, further comprising the step of:
    forming a dielectric layer over the conductive layer and the insulating layer.
3. The method of claim 1, wherein forming the sense layer comprises electroplating the sense layer.
4. The method of claim 2, further comprising the step of:
    planarizing an upper surface of the sense layer and the dielectric layer.
5. The method of claim 4, wherein the planarizing step is performed by chemical mechanical polishing.
6. The method of claim 4, wherein the planarizing step is performed by sputtering.
7. The method of claim 2, further comprising the step of:
    patterning the pinned layer, the nonmagnetic tunnel layer and the dielectric layer to form the memory cell.
8. The method of claim 1, wherein forming the sense layer comprises forming a plurality of layers to produce a ferromagnetic sense layer.
9. The method of claim 1, wherein forming the pinned layer comprises forming a plurality of layers to produce a ferromagnetic pinned layer.
10. A method of forming a memory cell, the method comprising:
    forming a conductive layer in a trench within an insulating layer;
    forming a dielectric layer over the conductive layer and the insulating layer;
    forming a first magnetic layer in openings that extend longitudinally over the conductive layer;
    planarizing an upper surface of the first magnetic layer and the dielectric layer;
    forming a nonmagnetic tunnel layer over the sense layer; and
    forming a second magnetic layer over the nonmagnetic tunnel layer.
11. The method of claim 10, wherein forming the first magnetic layer comprises forming the first magnetic layer by electroless plating.
12. The method of claim 10, wherein the planarizing step is performed by chemical mechanical polishing.
13. The method of claim 10, wherein the planarizing step is performed by sputtering.
14. The method of claim 10, wherein forming the first magnetic layer comprises forming a plurality of layers to produce a ferromagnetic first magnetic layer.
15. The method of claim 10, wherein forming the second magnetic layer comprises forming a plurality of layers to produce a ferromagnetic second magnetic layer.

* * * * *

UNITED STATES PATENT AND TRADEMARK OFFICE
CERTIFICATE OF CORRECTION

PATENT NO.       : 7,547,559 B2                                          Page 1 of 1
APPLICATION NO.  : 11/657725
DATED            : June 16, 2009
INVENTOR(S)      : Hasan Nejad et al.

It is certified that error appears in the above-identified patent and that said Letters Patent is hereby corrected as shown below:

On the title page, item (60), under "Related U.S. Application Data", in column 1, line 4, delete "6,761,644." and insert -- 6,716,644. --, therefor.

Signed and Sealed this

Twenty-eighth Day of July, 2009

JOHN DOLL
*Acting Director of the United States Patent and Trademark Office*